United States Patent [19]

Mulder et al.

[11] Patent Number: 5,680,001
[45] Date of Patent: Oct. 21, 1997

[54] ELECTRIC LAMP WITH ADHESION LAYER AND INTERFERENCE LAYER

[75] Inventors: Cornelis A.M. Mulder; Willibrordus H. M. M. Van De Spijker; Cornelis G. Visser, all of Eindhoven, Netherlands

[73] Assignee: U.S. Philips Corporation, New York, N.Y.

[21] Appl. No.: 516,907

[22] Filed: Aug. 18, 1995

[30] Foreign Application Priority Data

Aug. 22, 1994 [EP] European Pat. Off. .............. 94202397

[51] Int. Cl.$^6$ ........................................................ H01J 5/16
[52] U.S. Cl. ........................... 313/110; 513/112; 359/359; 359/586
[58] Field of Search .................................. 313/110, 112, 313/580, 578, 635, 489; 359/359, 586

[56] References Cited

U.S. PATENT DOCUMENTS

| | | | |
|---|---|---|---|
| 4,701,663 | 10/1987 | Kawakatsu et al. | 313/580 |
| 4,734,614 | 3/1988 | Kuus | 313/112 |
| 4,775,203 | 10/1988 | Vakil et al. | 350/1.7 |
| 4,940,636 | 7/1990 | Brock et al. | 428/426 |
| 5,138,219 | 8/1992 | Krisl et al. | 313/112 |

OTHER PUBLICATIONS

"Applications of Thin Film Reflecting Coating Technology to Tungsten Filament Lamps", by R.S. Bergman et al, IEEE Proc.–A, vol. 140, No. 6, Nov. 1993.

Coaton, "Editorial Light Sources", IEE Proceeding–A, vol. 140, No. 6, Nov. 1993, pp. 417–428.

*Primary Examiner*—Sandra L. O'Shea
*Assistant Examiner*—Vip Patel
*Attorney, Agent, or Firm*—Brian J. Wieghaus; Walter M. Egbert

[57] ABSTRACT

The electric lamp has a quartz glass lamp vessel in which a light source is accommodated. The lamp vessel is covered by an interference film which has layers of alternatingly silica and a material of relatively high refractive index. A silica containing adhesive layer is in between the lamp vessel and the film. The adhesive layer has a content of boron oxide and/or phosphorus oxide.

3 Claims, 1 Drawing Sheet

ELECTRIC LAMP WITH ADHESION LAYER AND INTERFERENCE LAYER

BACKGROUND OF THE INVENTION

The invention relates to an electric lamp provided with a quartz glass lamp vessel in which a light source is arranged, connected to current conductors which issue from the lamp vessel to the exterior, at least a portion of the lamp vessel being coated with an interference film which comprises alternate layers of silicon oxide and of a material of comparatively high refractive index, and which is provided on an adhesion layer comprising silicon oxide.

Such an electric lamp is known from U.S. Pat. No. 5,138,219.

The layers of comparatively high refractive index in the known lamp are made of tantalum oxide. Alternatively, however, these layers may consist of niobium oxide according to U.S. Pat. No. 4,734,614, or of titanium oxide according to U.S. Pat. No. 4,775,203. Alternatively again, these layers may consist of 88–95 mole % $TiO_2$ and 5–12 mole % $ZrO_2$ according to U.S. Pat. No. 4,940,636, or 88–95 mole % $TiO_2$ and 5–12 mole % $HfO_2$ or $TiO_2.ZrO_2$, $TiO_2HfO_2$, $TiO_2.Nb_2O_5$, $TiO_2.Ta_2O_5$, or $Ta_2O_5.2TiO_2$.

It is a disadvantage in lamps with an interference film on the lamp vessel that the film is exposed to strongly fluctuating temperatures. Independently of the materials used in the film and of the method by which the film was provided, in fact, there will be stresses in the film owing to differences in coefficient of expansion between the substrate, the lamp vessel, and the layers.

These stresses only lead to fine cracks in the film in a favourable case, for example with a comparatively low thermal load on the film, which is thus given a craquelé pattern. There is a risk, however, that cracks continue into the substrate, and portions of the film together with superficial flakes of the lamp vessel become detached. The effectiveness of the film is decreased thereby, and the strength of the damaged lamp vessel becomes less.

Efforts were made to counteract this disadvantage in the known lamp in that the film is deposited on the lamp vessel with the interposition of a silicon oxide layer provided by the same technology, low-pressure chemical vapour deposition (LPCVD) by which the film itself is provided. The adhesion layer, which has no appreciable optical effect because of its thickness of approximately 50 nm, would then be of the same material as the substrate, and would have the same non-optical physical properties as the layers of silicon oxide in the film. It was found, however, that the risk of flaking-off of the film is not effectively counteracted.

It is known from IEEE Proceedings-A, vol. 140, no. 6, November 1993, 417–428, in particular 427, that silicon oxide layers provided by LPCVD doped with boron oxide and/or phosphorus oxide reduce stresses in the film. The dopes reduce the viscosity of the silicon dioxide. Silicon dioxide with either or both impurities, however, is hygroseopic. This means that moisture absorbed while the lamp is not burning causes phase separations in the layers. These are detrimental to the film, whose durability is reduced and whose light scattering effect is increased.

SUMMARY OF THE INVENTION

It is an object of the invention to provide an electric lamp of the kind described in the opening paragraph whose interference film has an improved adhesion and durability.

According to the invention, this object is achieved in that the adhesion layer also comprises an oxide chosen from boron oxide and phosphorus oxide. It was found that the interference film of the electric lamp according to the invention retains its initial properties to a high degree during lamp life.

The adhesion layer of the interference film is enclosed between the substrate and the film, so that moisture from the surroundings experiences a barrier in reaching the adhesion layer, and the hygroseopic character of the doped silicon oxide cannot or substantially not manifest itself. The adhesion layer may in addition be comparatively thin and, unlike the known film, not every silicon oxide layer of the film itself need be doped. This means that, if moisture could affect the adhesion layer at all, the optical effect of this would be of minor importance.

The interference film in the lamp according to the invention is coupled to the substrate, i.e. the lamp vessel, by means of an adhesion layer of low viscosity, which is apparently sufficient for counteracting flaking-off of the film. It is also counteracted that cracks in the film, which lead to a craquelé pattern continue into the substrate.

The light source of the lamp may be an incandescent body, for example in a gas comprising halogen, but alternatively it may be pair of electrodes in an ionizable gas, for example a rare gas with metal halides, possibly with a buffer gas such as, for example, mercury. The light source may be surrounded by an inner gaslight envelope. It is also possible for an outer envelope to surround the lamp vessel.

The interference film may be light-transmitting and IR-reflecting. In that case, the film layers are comparatively thick with an optical thickness, i.e. refractive index multiplied by physical thickness, equal to one fourth a wavelength in the IR-range of the spectrum. Alternatively, however, the film may reflect UV and transmit light, or vice versa. The film may also be a band-pass film which transmits a potion of the visible radiation, but not other portions of the spectrum. The film was found to retain its favourable properties also in the case of an IR-reflecting film, so with comparatively thick layers, and also when a comparatively great number of layers was combined into a stack and the interference film accordingly had a comparatively great thickness of, for example, 3.5 to 4 µm.

The interference film may be provided, for example, in a usual manner, and so may the adhesion layer, for example both by immersion or by LPCVD, PVD (plasma enhanced CVD), or sputtering.

An adhesion layer of a few tens of nm, for example 50, was found to be satisfactory already. The doping level of the adhesion layer need be no more than a few % by weight, so that the silicon content of this layer is still comparatively high, for example 95 to 98% by weight. Nevertheless, the dopant may be readily demonstrated through Scanning Auger Microscopy.

BRIEF DESCRIPTION OF THE DRAWINGS

An embodiment of the electric lamp according to the invention is shown in the drawing, in which.

DESCRIPTION OF THE PREFERRED EMBODIMENTS

Figure 1:
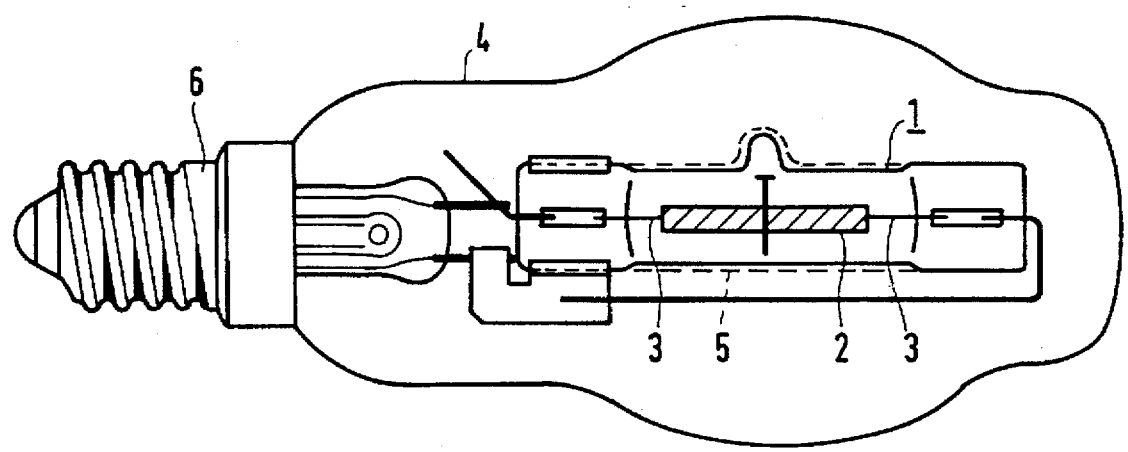
FIG. 1 shows an electric incandescent lamp in side elevation.
Figure 2:
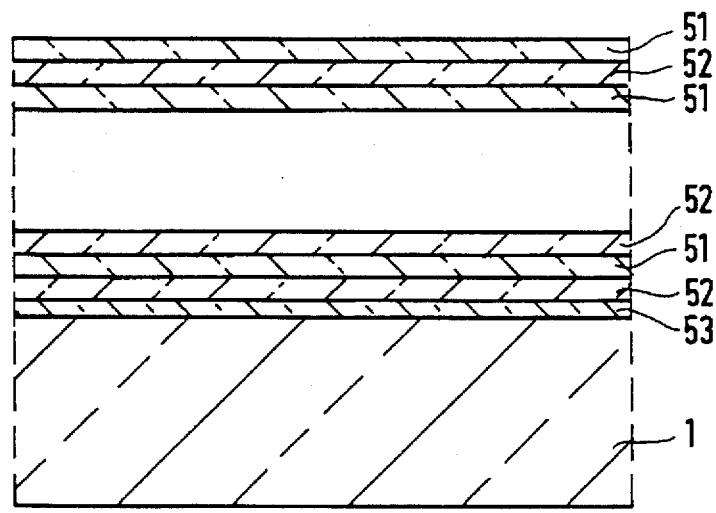
FIG. 2 shows a detail of FIG. 1.

In FIG. 1, the electric lamp has a quartz glass lamp vessel 1 in which an incandescent body is arranged as the light source 2. Current conductors 3 are connected thereto and issue from the lamp vessel to the exterior. The lamp vessel is filled with a gas comprising halogen, for example hydrogen bromide. At least a portion of the lamp vessel is coated with an interference film 5 which comprises alternate layers of silicon oxide 51 (see FIG. 2) and of a material 52 of comparatively high refractive index, provided on an adhesion layer 53 which comprises silicon oxide. The interference film transmits visible radiation and reflects infrared radiation.

The adhesion layer 53 in addition comprises an oxide chosen from boron oxide and phosphorus oxide.

The lamp vessel 1 is mounted in an outer envelope 4 which supports a lamp cap 5 to which the current conductors 3 are electrically connected.

The lamp shown is a 60 W mains voltage lamp with a rated life of approximately 2000 h. The lamp is provided by LPCVD with an adhesion layer and an interference film thereon having the build-up according to Table 1.

The adhesion layer has a thickness of approximately 50 nm and comprises approximately 3% by weight boron, calculated as an oxide. The layer was obtained through pyrolysis of a mixture of timethyl borate, diacetoxy-di-t-butoxysilane and oxygen. In the manufacture of a phosphorus oxide doped layer, for example, a mixture of phosphine, diacetoxy-di-t-butoxysilane and oxygen may be used. The layers of pure silicon oxide of the film were obtained from the same silane. The layers of comparatively high refractive index consisted of tantalum oxide and were obtained from penta-ethoxytantalum.

The interference film remained intact throughout lamp life and retained its initial properties.

| layer air | $SiO_2$ (nm) | $Ta_2O_5$ (nm) |
| --- | --- | --- |
| 1 | 85.9 | |
| 2 | | 125.1 |
| 3 | 35.0 | |
| 4 | | 19.2 |
| 5 | 193.1 | |
| 6 | | 14.7 |
| 7 | 22.7 | |
| 8 | | 126.6 |
| 9 | 31.4 | |
| 10 | | 21.7 |
| 11 | 211.8 | |
| 12 | | 24.0 |
| 13 | 21.7 | |
| 14 | | 172.9 |
| 15 | 19.6 | |
| 16 | | 27.4 |
| 17 | 208.5 | |
| 18 | | 24.0 |
| 19 | 28.6 | |
| 20 | | 123.7 |
| 21 | 11.8 | |
| 22 | | 16.7 |
| 23 | 171.7 | |
| 24 | | 28.3 |
| 25 | 11.0 | |
| 26 | | 105.2 |
| 27 | 18.4 | |
| 28 | | 33.5 |
| 29 | 182.1 | |
| 30 | | 109.1 |
| 31 | 170.5 | |
| 32 | | 31.6 |
| 33 | 9.1 | |
| 34 | | 121.3 |
| 35 | 11.9 | |
| 36 | | 31.4 |
| 37 | 165.1 | |
| 38 | | 98.2 |
| 39 | 145.7 | |
| 40 | | 95.3 |
| 41 | 143.3 | |
| 42 | | 95.2 |
| 43 | 154.2 | |
| 44 | | 102.9 |
| 45 substrate | 50* | |

*$SiO_2$ with a $B_2O_3$ content of 3% by weight.

We claim:

1. An electric lamp comprising a quartz lamp vessel, a light source arranged within said lamp vessel, current conductors connected to said light source which issue from the lamp vessel to the exterior, at least a portion of the lamp vessel being coated with an adhesion layer and an interference film on said adhesion layer, said interference film comprising alternate layers of silicon oxide and a material of comparatively high refractive index, and said adhesion layer comprising silicon oxide, characterized in that:

the adhesion layer also comprises an oxide chosen from boron oxide and phosphorus oxide.

2. An electric lamp as claimed in claim 1, characterized in that the adhesion layer has a silicon oxide content of 95 to 98% by weight.

3. An electric lamp as claimed in claim 1, wherein the light source is an incandescent body and the interference film is light-transmitting and IR-reflecting.

* * * * *